(12) United States Patent
Kristiansson et al.

(10) Patent No.: US 12,710,456 B2
(45) Date of Patent: Aug. 18, 2026

(54) DEVICE AND METHOD FOR MEASURING LEAKAGE CURRENT

(71) Applicant: Hitachi Energy Ltd, Zürich (CH)

(72) Inventors: Johan Emil Kristiansson, Stockholm (SE); Par Karlsson, Ludvika (SE); Anders Kvist, Sundbyberg (SE); Martin Sikström, Sundbyberg (SE)

(73) Assignee: HITACHI ENERGY LTD, Zürich (CH)

( * ) Notice: Subject to any disclaimer, the term of this patent is extended or adjusted under 35 U.S.C. 154(b) by 117 days.

(21) Appl. No.: 18/715,181

(22) PCT Filed: Nov. 14, 2022

(86) PCT No.: PCT/EP2022/081786
§ 371 (c)(1),
(2) Date: May 31, 2024

(87) PCT Pub. No.: WO2023/099180
PCT Pub. Date: Jun. 8, 2023

(65) Prior Publication Data

US 2025/0155478 A1 May 15, 2025

(30) Foreign Application Priority Data

Dec. 2, 2021 (EP) .................................... 21211958

(51) Int. Cl.
*G01R 19/22* (2006.01)
*G01R 19/165* (2006.01)
*H02H 9/04* (2006.01)

(52) U.S. Cl.
CPC ....... *G01R 19/22* (2013.01); *G01R 19/16519* (2013.01); *G01R 19/16538* (2013.01); *H02H 9/041* (2013.01)

(58) Field of Classification Search
None
See application file for complete search history.

(56) References Cited

U.S. PATENT DOCUMENTS

2005/0068792 A1* 3/2005 Yasumura ......... H02M 3/33571 363/21.06
2006/0114697 A1* 6/2006 Yasumura ......... H02M 3/33592 363/16
2016/0203932 A1* 7/2016 Niehoff ................ H01H 47/223 361/170

FOREIGN PATENT DOCUMENTS

EP 0246644 A2 11/1987
EP 3039701 A1 7/2016
(Continued)

OTHER PUBLICATIONS

Jong-Jae Lee et al.; DC-DC Converter Using a Multiple-Coupled Inductor for Low Output Voltages; IEEE Transactions on Industrial Electronics, vol. 54, No. 1, Feb. 2007; pp. 467-478 (Year: 2007).*
(Continued)

*Primary Examiner* — Nasima Monsur
(74) *Attorney, Agent, or Firm* — Sage Patent Group

(57) ABSTRACT

Device for measuring an alternating (AC) leakage current though a conductor, whereby the device includes: a conversion circuit including a magnetic core and a leakage current measurement circuit. The device includes a synchronous rectification circuit that includes a plurality of metal oxide semiconductor field effect transistors (MOSFETs). The conversion circuit is configured so that the conductor is arranged to pass through, or wind around the magnetic core, and the conversion circuit includes a plurality of pairs of secondary windings or a single secondary winding with a plurality of taps, whereby at least one first pair of secondary windings or at least one first pair of taps is configured to apply a voltage to the plurality of MOSFETs, and at least one
(Continued)

second pair of secondary windings or at least one second pair of taps is connected to the synchronous rectification circuit.

15 Claims, 2 Drawing Sheets

(56) References Cited

FOREIGN PATENT DOCUMENTS

| | | | |
|---|---|---|---|
| EP | 3039701 | B1 | 3/2021 |
| WO | 2015028634 | A1 | 3/2015 |

OTHER PUBLICATIONS

Extended European Search Report, European Application No. 21211958.0, mailed Jun. 10, 2022, 8 pages.
International Search Report and Written Opinion of the International Searching Authority, International Application No. PCT/EP2022/081786, mailed Feb. 28, 2023, 15 pages.
Lee, Jong-Jae et al, DC-DC Converter using a Multiple-Coupled Inductor for Low Output Voltages, IEEE Transactions on Industrial Electronics, vol. 54, No. 1, Feb. 2007, 12 pages.
International Preliminary Report on Patentability of the International Preliminary Examining Authority, International Application No. PCT/EP2022/081786, mailed Nov. 2, 2023, 10 pages.

* cited by examiner

Provide a device having:

- a conversion circuit comprising a magnetic core and at least two pairs of secondary windings or a single secondary winding with a plurality of taps,
- a synchronous rectification circuit comprising a plurality of MOSFETs, and
- a leakage current measurement circuit

↓

Pass a conductor that is to carry the AC leakage current that is to be measured through the magnetic core or wind the conductor around the magnetic core in one or more turns

↓

Configure at least one first pair of secondary windings or one first pair of taps to apply a voltage to the MOSFETs when the device is in use

↓

Connect at least one second pair of secondary windings or one second pair of taps to the synchronous rectifier circuit so as to rectify AC to DC and supply DC to the leakage current measurement circuit when the device is in use

↓

Provide an analog meter to display the leakage current

↓

Connect a plurality of overvoltage protection devices across the at least two pairs of secondary windings or at least two pairs of taps to protect the measurement circuit and MOSFETS from surge events when the device is in use

↓

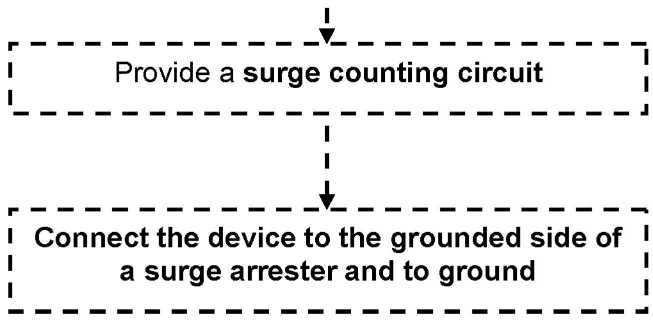

Fig. 2

DEVICE AND METHOD FOR MEASURING LEAKAGE CURRENT

CROSS-REFERENCE TO RELATED APPLICATIONS

This application is a 35 U.S.C. § 371 national stage application of PCT International Application No. PCT/EP2022/081786 filed on Nov. 14, 2022, which in turn claims priority to European Patent Application No. 21211958.0, filed on Dec. 2, 2021, the disclosures and content of which are incorporated by reference herein in their entireties.

TECHNICAL FIELD

The present disclosure concerns a device and method for measuring a leakage current though a conductor.

BACKGROUND

Overvoltage events caused by lightning strikes, switching operations or temporary surges, can result in power outages in power stations, substations, and electric power transmission and distribution lines. Surge arresters, which are configured to have a high impedance at normal operating voltage and a low impedance during a surge event, are usually installed between phase and ground to provide protection from excessive overvoltages caused by such overvoltage events. When the voltage across the surge arrester terminals exceeds a predetermined threshold voltage, the surge arrester conducts the current caused by the overvoltage to the ground.

The condition of a surge arrester can be monitored by measuring the leakage current through the ground conductor at the grounded side of a surge arrester. The total leakage current of a surge arrester is composed of a capacitive component and a resistive component, whereby the capacitive component is much larger than the resistive component. An increase in the resistive current, and consequently the total leakage current, indicates that the condition of the surge arrester has degraded.

A number of measurement methods have been utilized to reveal signs of deterioration and provide clues to impending surge arrester failure. Many of these measurements utilize sensitive leakage current measurement circuitry that can measure small changes in the total leakage current. When making such measurements, the leakage current at normal operating voltage is measured, but the sensitive measurement circuitry must at the same time be protected from overcurrents to which a surge arrester may be exposed during surge events.

One known method to measure the leakage current is a standard pass-through solution in which a solid metallic conductor carrying a primary current is passed through a toroidal core conversion circuit to generate a secondary current that is picked up by a leakage current measurement circuit. Conventional diodes are then used to rectify the secondary current signal. A problem with this approach is that very small secondary currents are generated in the toroidal core's secondary winding so passive electronics and cost-effective analog meters cannot be used to measure those small currents. Instead, active electronics with digital displays must be used to measure the leakage current through the conductor. A device with active electronics is likely to require external power sources such as solar cells, auxiliary power or powered by a battery that needs to be replaced periodically. Therefore, such an implementation increases the cost and complexity of the leakage current measurement device.

Another known method is to use a circuit comprising a metal oxide (MO) block to divert the leakage current to a measurement circuit. A drawback of this method is that the MO block must be selected to match the characteristics of the surge arrester whose leakage current is being measured (and which also contains MO blocks) and the process of assembling such a measurement circuit is complex.

It is also known to use a spark gap to divert the leakage current to a measurement circuit. Drawbacks with this method are the difficulties involved in providing a specific gap distance between electrodes and ensuring a safe failure mode. A very rigid housing is needed so that the spark gap distance is always accurately controlled, and there may be problems concerning the aging of the spark gap and fluctuations of the spark gap characteristics due to climate and environmental conditions, such as humidity, temperature or altitude.

SUMMARY

An object of the present disclosure is to provide an improved device for measuring an alternating (AC) leakage current though a conductor, i.e., the total leakage current through a conductor.

The term "measuring an AC leakage current" is intended to mean ascertaining the amount of leakage current flowing through a conductor and/or identifying the presence of a leakage current in a conductor. The word "measure" is therefore intended to mean "measure" and/or "detect".

This object is achieved by a device comprising the features recited in claim 1. The device comprises a conversion circuit comprising a magnetic core, and a leakage current measurement circuit. The device also comprises a synchronous rectification circuit that comprises a plurality of metal oxide semiconductor field effect transistors (MOSFETs).

The conversion circuit is configured so that the conductor, such as a ground conductor, is arranged to pass through, or wind around the magnetic core in one or more turns, and the conversion circuit comprises multiple secondary windings, i.e., a plurality of pairs of secondary windings, or a single secondary winding with a plurality of taps, such as a plurality of pairs of taps, whereby the plurality of pairs of secondary windings or the single secondary winding is wound around the magnetic core. Each pair of secondary windings or each pair of taps handles a positive or negative part of the AC current.

The conversion circuit is configured to convert a primary AC current in the conductor to a secondary AC current in the plurality of pairs of secondary windings or in the single secondary winding. At least one first pair of secondary windings or at least one first pair of taps is configured to apply a voltage to the plurality of MOSFETs. At least one second pair of secondary windings or at least one second pair of taps is connected to the synchronous rectification circuit, whereby the synchronous rectification circuit is configured to rectify the secondary AC current in the at least one second pair of secondary windings or at least one second pair of taps to a direct current (DC) and supply the DC current to the leakage current measurement circuit.

The device is configured to transfer electrical energy from the conductor carrying the AC leakage current, which constitutes a primary winding of the conversion circuit, to the leakage current measurement circuit via the synchronous rectification circuit. The leakage current measurement circuit is consequently powered by the leakage current that it is arranged to measure and thereby lacks an external power supply and active electronic components. Since electric energy can be transferred to the measurement circuit, active electronics with digital displays do not namely have to be used to enable measurement of the leakage current through the conductor.

Such a device enables a low loss conversion of the leakage current from the conductor to the multiple secondary windings or the single secondary winding of the conversion circuit. Additionally, since rectification is provided using a synchronous rectification circuit, rather than conventional diodes, high losses are not introduced during conversion or rectification. The device according to the present disclosure thereby enables a very low leakage current to be measured, such as a leakage current of 0 to 50 mA, or less than 10 mA, or less than 1 mA, or less than 0.1 mA. Furthermore, the conductor carrying the AC leakage current to be measured forms a continuous current path through the device.

The synchronous rectification circuit of the device according to the present disclosure improves the efficiency of rectification by replacing conventional semiconductor diodes with MOSFETs. Conventional semiconductor diodes have a fixed voltage drop of about 0.5 to 1.0 volts, whereas MOSFETs behave as resistances and can have a very low voltage drop. Even though a MOSFET is an active electronic component, it requires almost no input current to control the load current, compared to a bipolar junction transistor (BJT).

According to an embodiment of the present disclosure, the gate threshold voltage of a MOSFET, or the minimum voltage that is needed to create a conducting path between its source and drain terminals, is selected to be extremely low (0 Volts) so as to minimize the rectification voltage drop once the at least one second pair of secondary windings or the at least one second pair of taps opens the MOSFETS of the synchronous rectification circuit.

According to an embodiment of the present disclosure, the leakage current measurement circuit comprises an analog meter (a passive electronic component) configured to display the leakage current. Such a device enables a low leakage current to be measured whilst part of the leakage current is used to power the analog meter, which results in a cost-effective solution. No active electronic component with a digital display is required to measure or detect a leakage current through a conductor.

According to an embodiment of the present disclosure, the device comprises a plurality of overvoltage protection devices, such as transient-voltage-suppression (TVS) diodes, connected across the at least two pairs of secondary windings or the at least two pair of taps. The overvoltage protection devices are configured to protect the measurement circuit and the plurality of MOSFETS during surge events by limiting the maximum voltage across the measurement circuit and the MOSFET gates at high primary current.

The device according to the present disclosure is configured to isolate the leakage current measurement circuit from the conductor carrying the leakage current during a surge event. During normal operation, i.e., when there is no surge event and the leakage current in the conductor is to be measured, leakage current will be transferred to the leakage current measurement circuit via the synchronous rectification circuit. When a surge event occurs, the voltage being applied to the overvoltage protection devices will change and this will change the electrical conductivity of the overvoltage protection devices ensuring that overcurrents do not flow through the leakage current measurement circuit.

According to an embodiment of the present disclosure, the conversion circuit is configured so that the conductor winds around the magnetic core in a single turn, which constitutes a primary winding having a single turn. Alternatively, the conversion circuit is configured so that the conductor winds around the magnetic core in a plurality of turns, which constitutes a primary winding having multiple turns. The conversion circuit may be configured so that the conductor winds around the magnetic core in any number of turns, whose number may be selected depending on the magnitude of the leakage current being measured and the desired measurement sensitivity level.

It should be noted that the number of turns in the conductor (which constitutes the primary winding of the conversion circuit) and the number of turns of the secondary windings or in the single secondary winding may be selected depending on the current range to be measured, magnetic core characteristics, MOSFET characteristics and the type of analog meter used. The ratio between the number of turns in the conductor and in each secondary winding or in the single secondary winding is selected so as to achieve the desired output voltage.

According to an embodiment of the present disclosure, the at least one first pair of secondary windings or at least one first pair of taps comprises a higher number of turns or a higher number of turns therebetween than the at least one second pair of secondary windings or than between the at least one second pair of taps. For example, the ratio of turns of the at least one first pair of secondary windings or between the at least one first pair of taps to the at least one second pair of secondary windings or between the at least one second pair of taps may be at least 2:1, at least 3:1, at least 4:1, at least 5:1, at least 6:1, at least 7:1, at least 8:1, at least 9:1, at least 10:1, or at least 20:1.

According to an embodiment of the present disclosure, the conversion circuit comprises four, six or eight or ten secondary windings in total.

According to an embodiment of the present disclosure, the device comprises a surge counting circuit.

According to an embodiment of the present disclosure, the magnetic core has a high permeability to enable a high magnetic flux to be generated in the magnetic core, which enables a very low primary current to be converted and measured using the device according to the present disclosure. For example, the magnetic core may comprise at least one of the following materials: nickel, carbon steel, martensitic stainless steel, ferritic stainless steel, iron having a purity of at least 99.8%, cobalt iron, Mu-metal, permalloy, or metglas. In some embodiments, the magnetic core may be a construction comprising a plurality of laminated sheets or layers of one or more materials having a high permeability.

According to an embodiment of the present disclosure the magnetic core may be a toroidal magnetic core. The magnetic core may however be of any suitable shape such as a core having a circular, oval, square, rectangular or polygonal cross section.

According to an embodiment of the present disclosure the device comprises the step of providing the device with a surge counting circuit, such as a surge counting circuit that includes a magnetic core and that is configured so that said conductor is arranged to pass through, or wind around said magnetic core. The conductor will thereby form a continuous current path through both the conversion circuit and the surge counting circuit.

The present disclosure also concerns a method for measuring an alternating (AC) leakage current though a conductor, such as a ground conductor. The method comprises the step of providing a device, such as a device according to any of the embodiments of the present disclosure, whereby the device comprises a conversion circuit comprising a magnetic core, a synchronous rectification circuit that comprises a plurality of metal oxide semiconductor field effect transistors (MOSFETs), and a leakage current measurement circuit.

The method comprises the steps of passing the conductor through the magnetic core or winding the conductor around the magnetic core, whereby the conductor constitutes a primary winding of the conversion circuit and providing the conversion circuit with a plurality of pairs of secondary windings or a single secondary winding with a plurality of taps, such as a plurality of pairs of taps, whereby the plurality of pairs of secondary windings or the single secondary winding is wound around the magnetic core, whereby the conversion circuit is configured to convert a primary AC current in the at least one primary winding to a secondary AC current in the plurality of pairs of secondary windings or in the single secondary winding.

The method also comprises the steps of configuring at least one first pair of secondary windings or at least one first pair of taps to apply a voltage to the plurality of MOSFETs, and connecting at least one second pair of secondary windings or at least one second pair of taps to the synchronous rectification circuit, and configuring the synchronous rectification circuit to rectify the secondary AC current in the at least one second pair of secondary windings or the at least second first pair of taps to a direct current (DC) and supplying the DC current to the leakage current measurement circuit. The steps of the method according to the present disclosure may be carried out in any suitable order.

According to an embodiment of the present disclosure, the method comprises the step of providing the leakage current measurement circuit with an analog meter configured to display the leakage current.

According to an embodiment of the present disclosure, the method comprises the step of connecting a plurality of overvoltage protection devices, such as transient-voltage-suppression (TVS) diodes, across the plurality of pairs of secondary windings or across the plurality of taps to protect the measurement circuit and the plurality of MOSFETS from surge events.

According to an embodiment of the present disclosure, the method comprises at least one of the following steps: arranging the conductor to wind around the magnetic core one or more turns, providing the at least one first pair of secondary windings or the at least one first pair of taps with a higher number of turns or a higher number of turns therebetween than the at least one second pair of secondary windings or than between the at least one first pair of taps, and/or providing four, six or eight or ten secondary windings or pairs of taps in total. The device may however comprise any number of pairs of secondary windings or taps.

According to an embodiment of the present disclosure the method comprises the step of providing the device with a surge counting circuit, such as a surge counting circuit that includes a magnetic core and that is configured so that said conductor is arranged to pass through, or wind around said magnetic core.

According to an embodiment of the present disclosure the method comprises the step of providing a magnetic core comprising at least one of the following materials: nickel, carbon steel, martensitic stainless steel, ferritic stainless steel, iron having a purity of at least 99.8%, cobalt iron, Mu-metal, permalloy, or metglas.

According to an embodiment of the present disclosure the method comprises the step of connecting the device to the grounded side of a surge arrester and to ground, for safety reasons.

BRIEF DESCRIPTION OF THE DRAWINGS

The present disclosure will hereinafter be further explained by means of non-limiting examples with reference to the appended schematic figures where;

FIG. 2 shows the steps of a method according to an embodiment of the present disclosure.

Figure 1:
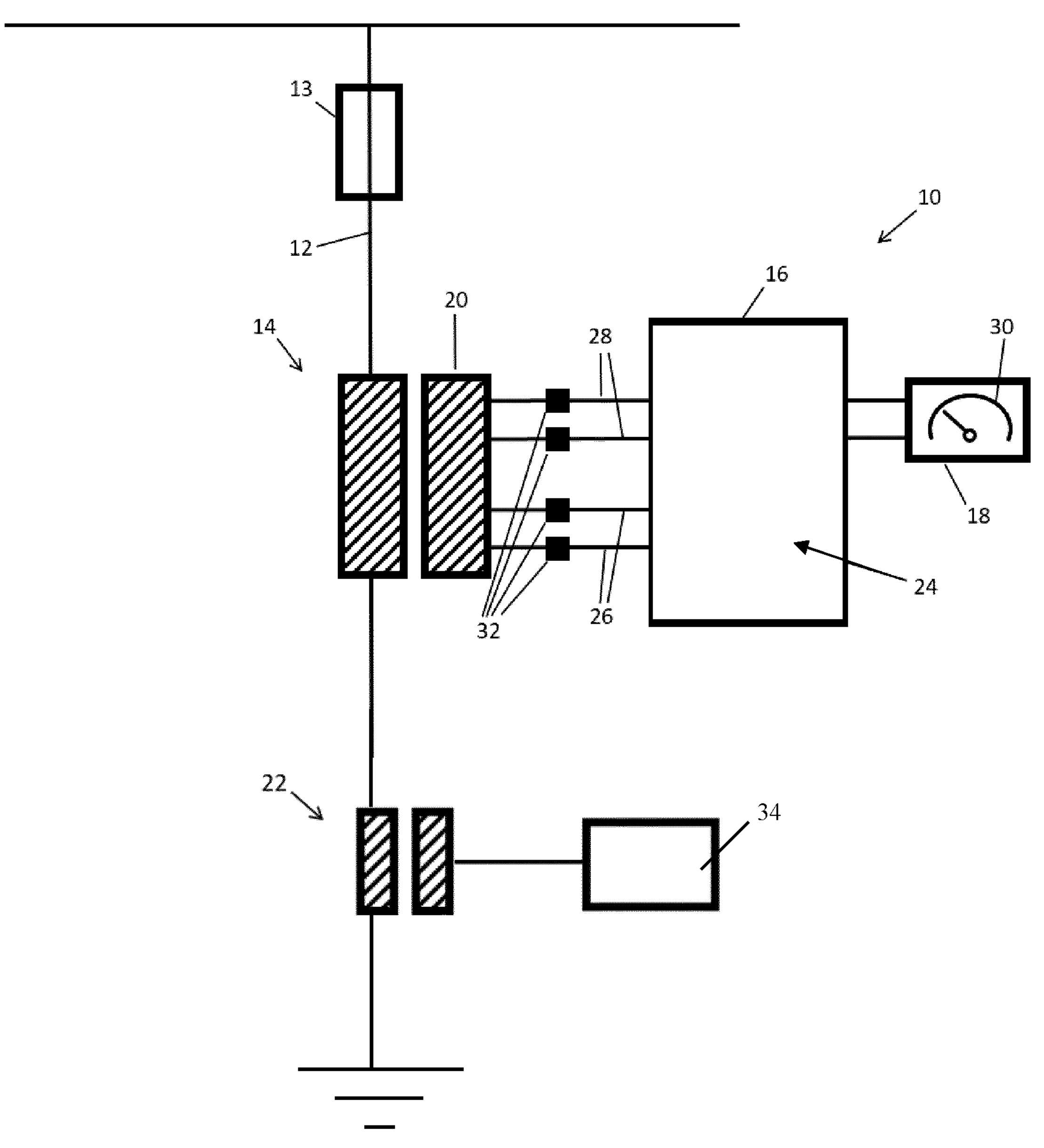
FIG. 1 shows a device according to an embodiment of the present disclosure.

It should be noted that the drawings have not necessarily been drawn to scale and that the dimensions of certain features may have been exaggerated for the sake of clarity.

Any feature of any embodiment of the device or method depicted or described in any part of this document may be combined with any one or more features of any other embodiment, unless such a combination is explicitly excluded herein.

DETAILED DESCRIPTION

FIG. 1 schematically shows a surge arrester 13 that is arranged to protect at least one electric device, connected to a power transmission or distribution line for example, from surge events. A device 10 according to an embodiment of the present disclosure is arranged so that a grounded conductor 12 of a surge arrester 13 passes through or is wound around the magnetic core of a conversion circuit 14 of the device 10. The grounded conductor 12 thereby forms a continuous current path through the device 10.

The magnetic core 20 and has a high permeability and may be a toroidal magnetic core comprising high purity ferromagnetic material, such as laminated iron, iron powder, or ferrite.

The device 10 also comprises a synchronous rectification circuit 16 that comprises a plurality of MOSFETs 24, and a leakage current measurement circuit 18.

The ground conductor 12 constitutes a primary winding of the conversion circuit 14 and may be wound around the magnetic core 20 in one or more turns. The ground conductor 12 carries the AC leakage current that is to be measured, such as a 50 Hz AC leakage current. The conversion circuit 16 also comprises four secondary windings, i.e., two pairs of secondary windings 26, 28, that are wound around the magnetic core 20.

The conversion circuit 14 is configured to convert the primary current in the ground conductor 12 to a secondary current in the secondary windings 26, 28, whereby the conductor 12 draws electrical energy from the grounded side of the surge arrester 13 and the secondary windings 26, 28 deliver the electrical energy at the transformed voltage to other parts of the device 10.

A first pair of secondary windings 26, which may each comprise 1800 turns for example, is configured to apply a voltage to the gates of the MOSFETs 24, and a second pair of secondary windings 28, which may each comprise 200 turns for example, is configured to rectify AC current in the second pair of secondary windings 28 to a direct current (DC) and supply the DC current to the leakage current measurement circuit 18.

The lower turn (200 turns) second pair of secondary windings 28 provides electrical energy for the leakage current measurement circuit 18. The higher turn (1800 turns) first pair of secondary windings 26 generate a voltage that is high enough to operate the gates of the MOSFETs 24. MOSFETs 24 with an extremely low gate threshold are selected so as to minimize the rectification voltage drop once the higher turn first pair of secondary windings 26 opens the MOSFET 24.

The leakage current measurement circuit 18 also comprises an analog meter 30 configured to display the leakage current being measure which does not require a battery or separate power supply. The illustrated device 10 comprises a plurality of overvoltage protection devices 32, namely a plurality of TVS diodes, connected across the two pairs of secondary windings 26, 28 which is configured to protect the leakage current measurement circuit 18 and the plurality of MOSFETS 24 of the synchronous rectification circuit. A TVS diode operates by shunting excess current when the induced voltage exceeds the avalanche breakdown potential. A TVS diode suppresses all overvoltages above its breakdown voltage. It automatically resets when the overvoltage goes away.

Any suitable overvoltage protection devices 32 may be used to protect the leakage current measurement circuit 18. All of the overvoltage protection devices 32 in a plurality of overvoltage protection devices 32 need not necessarily be of the same type. For example, a plurality of overvoltage protection devices 32 may comprise at least one of the following: a TVS diode, an avalanche diode, a metal oxide varistor, a crowbar circuit, a discharge tube, a Zener diode and/or an arcing horn.

The illustrated device 10 also comprises a surge counting circuit 34 comprising a magnetic core 22. The surge counting circuit 34 is configured to register, and optionally display, surges. A conductor 12 may be arranged to pass through or wind around the magnetic core 20 of a device 10 and then to pass through or wind around the magnetic core 22 of a surge counter 34 as shown in FIG. 1. Alternatively, a conductor 12 may be arranged to pass through or wind around the magnetic core 22 of a surge counter 34 and then to pass through or wind around the magnetic core 20 of a device 10.

A device 10 according to the present disclosure may comprise one or more additional condition monitoring devices to facilitate predictive maintenance for a surge arrester 13.

Rather than providing a device with a plurality of secondary windings 28 as illustrated in FIG. 1, a device 10 according to the present disclosure may comprise a single secondary winding with multiple taps.

FIG. 2 shows the essential steps of a method for measuring a leakage current though a ground conductor. The method comprises step of providing a device having a conversion circuit comprising a magnetic core and at least two pairs of secondary windings or a single secondary winding with a plurality of taps, a synchronous rectification circuit comprising a plurality of MOSFETs, and a leakage current measurement circuit. The method also comprises the step of passing a conductor that is to carry the AC leakage current that is to be measured through the magnetic core of the conversion circuit or wind the conductor around the magnetic core in one or more turns. The method further comprises the step of configuring at least one first pair of secondary windings or at least one first pair of taps to apply a voltage to the gates of a plurality of MOSFETs. The method further comprises the steps of connecting at least one second pair of secondary windings or at least one second pair of taps to the synchronous rectification circuit to rectify alternating current (AC) to direct current (DC) and supply the direct current (DC) to the leakage current measurement circuit. The steps do not have to be carried out in the order presented in FIG. 2 but may be carried out in any suitable order.

Such a method may be used to identify in good time whether a surge arrester is capable of reliably arresting surges or whether it has been damaged or is at risk of failure and may thereby reduce downtime, increase electric grid reliance, and reduce maintenance costs.

In some embodiments the method may comprise at least one of the steps of providing the leakage current measurement circuit with an analog meter configured to display the leakage current, connecting a plurality of overvoltage protection devices, such as TVS diodes, across the at least two pairs of secondary windings or across the at least two pairs of taps that are configured to protect the measurement circuit and the plurality of MOSFETS, providing the device with a surge counting circuit and/or connecting the device to the grounded side of a surge arrester and to ground.

Further modifications of the present disclosure within the scope of the claims would be apparent to a skilled person.

The invention claimed is:

1. A device for measuring an alternating (AC) leakage current through a conductor, whereby said device comprises:

a conversion circuit comprising a magnetic core and a leakage current measurement circuit, wherein said device comprises a synchronous rectification circuit that comprises a plurality of metal oxide semiconductor field effect transistors (MOSFETs), and said conversion circuit is configured so that said conductor is arranged to pass through, or wind around said magnetic core, and said conversion circuit comprises a plurality of pairs of secondary windings or a single secondary winding with a plurality of taps, whereby said plurality of pairs of secondary windings or said single secondary winding is wound around said magnetic core, whereby said conversion circuit is configured to convert a primary AC current in said conductor to a secondary AC current in said plurality of pairs of secondary windings or said single secondary winding, whereby at least one first pair of secondary windings is configured to apply a voltage to said plurality of MOSFETs, and at least one second pair of secondary windings or at least one first pair of taps is connected to said synchronous rectification circuit, whereby said synchronous rectification circuit is configured to rectify said secondary AC current in said at least one second pair of secondary windings or in said at least one second pair of taps to a direct current (DC) and supply said DC current to said leakage current measurement circuit.

2. The device according to claim 1, wherein said leakage current measurement circuit comprises an analog meter configured to display said leakage current.

3. The device according to claim 1, wherein the device comprises a plurality of overvoltage protection devices, such as transient-voltage-suppression (TVS) diodes, connected across said plurality of secondary windings or across said plurality of taps that is configured to protect said leakage current measurement circuit and said plurality of MOSFETs.

4. The device according to claim 1, wherein said at least one first pair of secondary windings or said at least one first pair of taps comprises a higher number of turns or a higher number of turns therebetween than said at least one second pair of secondary windings or than between said at least one second pair of taps.

5. The device according to claim 1, wherein said conductor is a ground conductor.

6. The device according to claim 1, wherein said conversion circuit comprises four, six, eight or ten secondary windings or pairs of taps.

7. The device according to claim 1, wherein the device comprises a surge counting circuit, such as a surge counting circuit that includes a magnetic core and that is configured so that said conductor is arranged to pass through, or wind around said magnetic core.

8. The device according to claim 1, wherein said magnetic core comprises at least one of said following materials: nickel, carbon steel, martensitic stainless steel, ferritic stainless steel, iron having a purity of at least 99.8%, cobalt iron, Mu-metal, permalloy, or metglas.

9. A method for measuring an alternating (AC) leakage current through a conductor, such as a ground conductor, whereby said method comprises the step of providing a device comprising:

a conversion circuit comprising a magnetic core, and a leakage current measurement circuit, wherein the method comprises the steps of:

providing a synchronous rectification circuit that comprises a plurality of metal oxide semiconductor field effect transistors (MOSFETs), passing said conductor through said magnetic core or winding said conductor around said magnetic core, whereby said conductor constitutes a primary winding of the conversion circuit, providing said conversion circuit with a plurality of pairs of secondary windings or a single secondary winding with a plurality of taps, whereby said plurality of pairs of secondary windings or said single secondary winding is are wound around said magnetic core, whereby said conversion circuit is configured to convert a primary AC current in said at least one primary winding to a secondary AC current in said plurality of pairs of secondary windings or said single secondary winding, and configuring at least one first pair of secondary windings or at least one first pair of taps to apply a voltage to said plurality of MOSFETs, and connecting at least one second pair of secondary windings or at least one second pair of taps to said synchronous rectification circuit, and configuring said synchronous rectification circuit to rectify said secondary AC current in said at least one second pair of secondary windings or said single secondary winding to a direct current (DC) and supplying said DC current to said leakage current measurement circuit.

10. The method according to claim 9, further comprising providing said leakage current measurement circuit with an analog meter configured to display said leakage current.

11. The method according to claim 9, further comprising connecting a plurality of overvoltage protection devices across said plurality of pairs of secondary windings or across said plurality of pairs of taps that is configured to protect said measurement circuit and said plurality of MOSFETs.

12. The method according to claim 9, further comprising at least one of the following steps:

providing said primary winding comprises a single turn;

providing said at least one first pair of secondary windings or at least one first pair of taps with a higher number of turns or with a higher number of turns therebetween than said at least one second pair of secondary windings or than between said at least one second pair of taps; or providing four, six, eight or ten secondary windings or pairs of taps.

13. The method according to claim 9, further comprising providing said device with a surge counting circuit that comprises a magnetic core and passing said conductor through said magnetic core or winding said conductor around said magnetic core.

14. The method according to claim 9, further comprising providing a magnetic core comprising at least one of said following materials: nickel, carbon steel, martensitic stainless steel, ferritic stainless steel, iron having a purity of at least 99.8%, cobalt iron, Mu-metal, permalloy, or metglas.

15. The method according to claim 9, further comprising connecting said device to the grounded side of a surge arrester and to ground.

* * * * *